United States Patent [19]

Barclay et al.

[11] Patent Number: 5,569,325
[45] Date of Patent: Oct. 29, 1996

[54] PROCESS FOR GROWING CRYSTALS

[75] Inventors: David A. Barclay; Duane J. Lewis, both of Austin; Lewis B. Decker, Jr., Lago Vista; William R. Carradine, Austin, all of Tex.

[73] Assignee: Condea Vista Company, Houston, Tex.

[21] Appl. No.: 690,164

[22] Filed: Apr. 22, 1991

[51] Int. Cl.$^6$ .................................................. C30B 15/02
[52] U.S. Cl. ............................. 117/18; 117/33; 117/912
[58] Field of Search ............................. 156/621, 623 R, 156/DIG. 61; 423/625

[56] References Cited

U.S. PATENT DOCUMENTS

| 4,117,105 | 9/1978 | Hertzenberg et al. | 423/625 |
| 4,193,768 | 3/1980 | Ohishi et al. | 156/623 R |
| 4,797,139 | 1/1989 | Bauer | 423/628 |
| 4,994,253 | 2/1991 | Brown | 423/121 |

FOREIGN PATENT DOCUMENTS 8385756  6/1960  United Kingdom .

*Primary Examiner*—R. Bruce Breneman
*Assistant Examiner*—Felisa Garrett
*Attorney, Agent, or Firm*—Browning Bushman

[57] ABSTRACT

A process for growing crystals at an enhanced rate comprising providing a dispersion of a fluid medium and seed crystals of a metal oxide, introducing feed material comprising a metal oxide into the dispersion and maintaining a uniform mixture of the seed crystals, the feed material and the fluid medium, the feed material having an average crystal size less than the average crystal size of the seed crystals, the feed material being added in an amount and at a rate whereby the seed crystals grow, the feed material providing a soluble nutrient species for deposition of the said crystal to effect crystal growth, the mixture of seed crystals and feed material being treated under conditions which stimulate crystal growth for a period of time sufficient to obtain a desired quantity of a product comprising at least one grown crystal having an average crystal size greater than the average crystal size of the seed crystal.

16 Claims, 1 Drawing Sheet

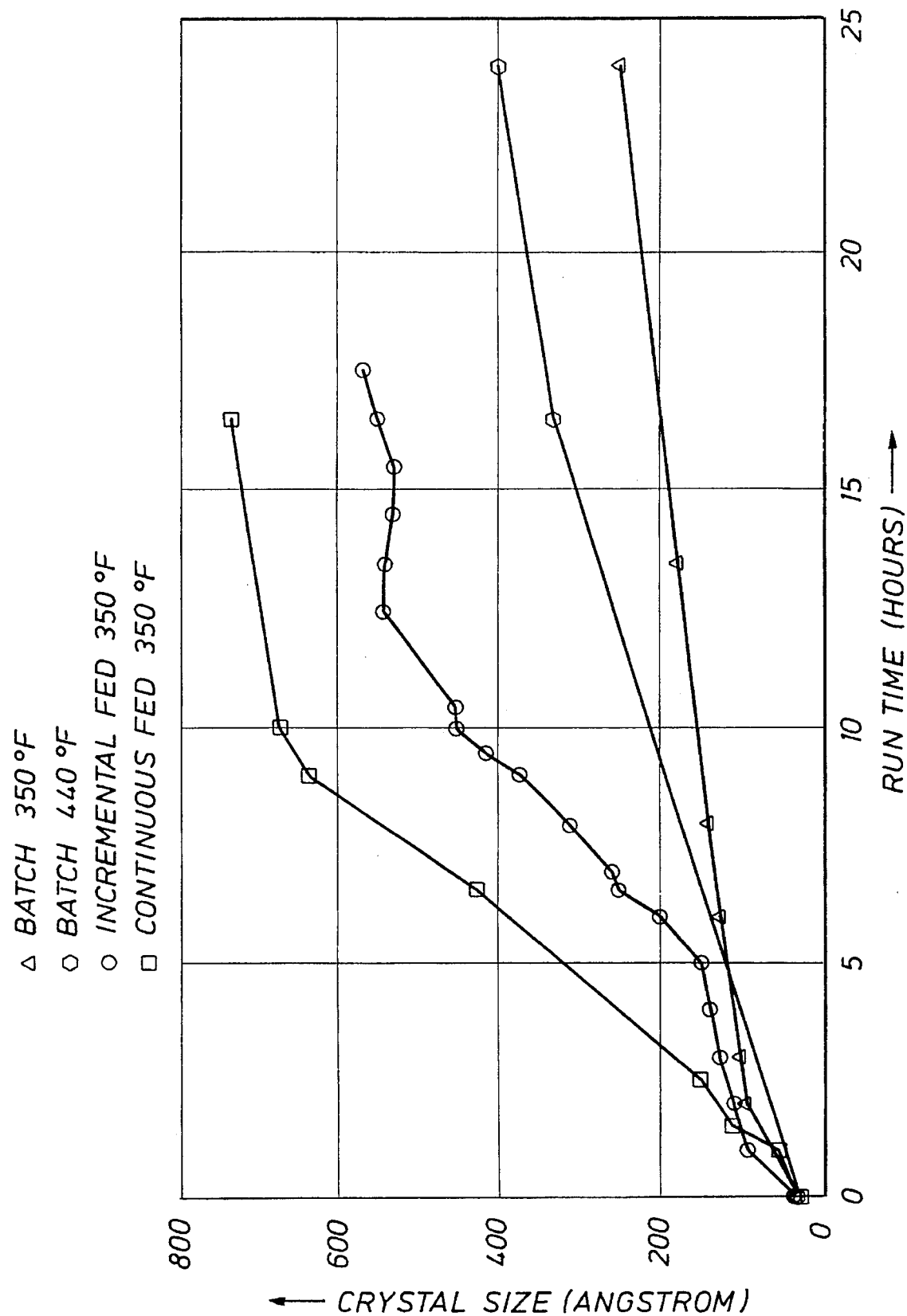

PROCESS FOR GROWING CRYSTALS

BACKGROUND OF THE INVENTION

1. Field of the Invention

The present invention relates to a process for growing crystals at an enhanced rate, particularly crystals of a metal oxide. In a particular embodiment, the present invention relates to a process for growing large, i.e. greater than about 150 Angstroms, crystal size, hydrated aluminas at an enhanced rate.

2. Description of the Background

There are many instances in which it is desirable to obtain large, uniform crystals of a given substance. One obvious case is the production of gem stones by crystal growth in an attempt to obtain flawless gem quality crystals. Also, high purity, uniform flawless single crystals of sufficient size are finding increasing utility in lasers, solid state electronics and other high tech fields.

Another application is in the production of Uniform crystal size ceramic particles for use in high tech ceramic parts. It is known that use of ceramic powders having certain crystal size/particle size allows for more controlled and uniform particle packing when preparing the ceramic green body. For example, too large a particle size results in non-uniform packing of particles during formation of the ceramic green body. This results in flaws and limited mechanical strength in the finished ceramic part. Likewise, if the particle size is too small, i.e. less than about 0.2 microns diameters, it again becomes difficult to obtain the desired, uniform packing in the green body. This is primarily due to difficulty in completely dispersing the small particles at concentrations which are preferred for commercial ceramic part forming processes such as slip casting.

In U.K. Patent No. 838,575, entitled "Method of Growing Corundum Crystals", there is disclosed a method of growing large single crystals of corundum of a size suitable for gems from seeds in aqueous media under high temperatures and pressures. In the method disclosed in the British patent, which is a batch method, the seed crystals, contained in a pressurized vessel, are subjected to a mass of alumina containing nutrient adapted to supply corundum for growth of the seed crystal, both the seed crystal and the nutrient mass being in contact with an aqueous medium which is present in an amount sufficient to occupy at least sixty-five percent of the free space within the container at room temperature. The method disclosed in the British patent is, as mentioned, a batch process which does not rely on uniform dispersion of feed material to supply nutrient for crystal growth, relies on a one time, single charge of nutrient material, fails to recognize the advantage of "feeding" crystals having an average crystal size less than the seed crystal in order to enhance growth of the seed crystal and requires a temperature differential between the nutrient mass and the seed crystal.

SUMMARY OF THE INVENTION

It is therefore an object of the present invention to provide an improved process for growing crystals at an enhanced rate.

A further object of the present invention is to provide an improved process for growing crystals of metal oxides.

Still another object of the present invention is to provide a process for growing hydrated alumina crystals having a size greater than about 150 Angstroms.

The above and other objects of the present invention will become apparent from the description given herein, the drawing and the appended claims.

In accord with the present invention, a dispersion of a fluid medium and at least one seed crystal of a metal oxide species is provided, the seed crystal providing a growth site. Preferably, there is a dispersion of a fluid medium and a plurality of such seed crystals. Feed material of a metal oxide species is introduced into said dispersion and a generally uniform mixture of said seed crystal(s), fluid medium and feed material formed. The feed material has an average crystal size smaller than the average crystal size of the seed crystal(s), the feed material being added in an amount and at a rate to effect growth of the seed crystal(s). The feed material has sufficient solubility in the fluid medium to provide a soluble nutrient species for deposition on the seed crystal(s) to effect said growth. The feed material is introduced over a given period of time during which crystal growth is occurring. The mixture of seed crystal(s), feed material and fluid medium is treated under conditions which stimulate crystal growth for a period of time sufficient to obtain a desired quantity of the product comprising at least one grown crystal having a desired average crystal size greater than the average crystal size of the starting seed crystal(s).

BRIEF DESCRIPTION OF THE DRAWINGS

The single figure is a graph showing a comparison of alumina crystal size obtained by the process of the present invention as compared with conventional batch hydrothermal treatments.

DESCRIPTION OF THE PREFERRED EMBODIMENTS

The process of the present invention employs the phenomenon known as Ostwald ripening. In Ostwald ripening, via a dissolution/redeposition mechanism, larger crystals in a heterogeneous system become larger at the expense of smaller crystals becoming smaller. Eventually the smaller crystals disappear leaving only the larger crystals. Since one crystal will always be largest in the system, in theory, Ostwald ripening can continue until only a single large crystal remains. In practice, however, as the smaller crystals are depleted from the system, the growth rate of the larger crystals slows significantly. Nonetheless, the present invention has been able to utilize Ostwald ripening, in a unique feeding process, to grow crystals at a faster rate than can be accomplished using typical batch techniques.

While the present invention will be described with particular reference to growing hydrated alumina crystals, it is to be understood that it is not so limited. The process of the present invention can be employed to grow crystals of virtually any metal oxide species by depositing or growing on one or more seed crystals a nutrient species derived from a feed material, seed crystals, fluid medium and feed material being generally uniformly dispersed. The term "metal oxide species" is intended to encompass those compounds in which the metal portion of the oxide is a metal in the true sense, e.g. aluminum, zirconium, iron, etc., as well as silicon, boron, arsenic and tellurium which, although not metals, are constituents of many highly important crystals. Thus, the process of the present invention is applicable to metal oxide species as well as the other oxide species mentioned above and mixtures thereof. For purposes of simplicity the terms "metal oxide(s)" and "metal oxide species" will encompass oxides of boron, silicon, arsenic and tellurium. It is also contemplated that the terms "metal oxide(s)" and "metal oxide species" encompasses the unhydrated as well as the numerous hydrated forms of such metal oxides. For example, it is well known that alumina exists as alpha alumina, $Al_2O_3$, as well as in the form of numerous hydrated aluminum oxides discussed below.

While generally speaking, the feed material will be the same as or a precursor of the ultimate grown crystal obtained as a product, it is contemplated that the seed crystal can be of one material and the grown crystal made up of the original seed material and another material. Such a heterogenous or hybrid grown crystal, for example, might be grown from an original seed crystal of alumina with a growth portion comprised of iron oxide or some other metal oxide. In the usual case, however, and as noted, the feed material will be the same as or a precursor of the seed crystals. Thus, if alpha alumina (corundum) is the seed crystal, the feed material will be corundum or a hydrated alumina, e.g. boehmite.

The feed material, while a metal oxide/metal oxide species, as noted above, need not be the same as the seed crystal but must have sufficient solubility in the fluid medium to provide a soluble nutrient species, e.g. metal oxide species, for deposition on the seed crystal to effect the growth of the seed crystal. As is well known, metal and silicon oxides have limited to little solubility in most common liquid mediums, i.e. aqueous mediums. However, under proper conditions of temperature, pressure, crystal size and agitation, plus, in some cases, additional constituents in the fluid medium to enhance dissolution and/or crystal growth if desired, a sufficient amount of dissolution of such feed material will occur to provide a soluble nutrient species which will deposit on the seed crystal effecting growth of the seed crystal(s).

The process of the present invention is distinguished from prior art batch processes by the critical step of introducing the feed material over a given period of time during which crystal growth occurs. Thus, rather than in a process in which seed crystal, feed material and fluid medium are all introduced in essentially a one-step addition as a single mixture into a reactor such as a autoclave and the seed crystal grown under batch conditions, in the process of this invention all of the feed material is not added at once but rather is added or spread out over time during which crystal growth is occurring. Such addition of feed material over time, generally thirty minutes or greater, can be carried out intermittently in which portions of the feed material are introduced at discreet intervals of time or continuously in which the feed material is being constantly metered, uniformly if desired, into the system over a period of time during which crystal growth is occurring.

It will be appreciated, as described more fully hereafter with respect to hydrated alumina seed crystals, that the rate and amount of feed crystals added will vary over wide limits depending on the starting seed crystals, the nature of the feed material, temperatures, pressures, the nature of the fluid medium, and other such factors. However, those skilled in the art can readily adjust such parameters in a given seed crystal/feed material/fluid medium mixture to obtain the desired growth rate and desired growth size of the product crystals.

It will also be appreciated that the metal oxide serving as seed will possess sufficient insolubility in the fluid medium to provide a solid growth site for the crystal growth. Obviously, conditions must not be such so as to completely dissolve the seed crystals. It is also important that the feed material have an average crystal size less than the average crystal size of the seed crystal to take advantage of the mechanism involved in the crystal growth process.

As noted above, the present invention will be described with specific reference to the growth of hydrated alumina, the term "hydrated alumina" referring to any alumina which is associated with water of hydration as for example, pseudoboehmite, boehmite, bayerite, diaspore, etc.

It is recognized that hydrated aluminas, such as boehmite, can be calcined to produce anhydrous $Al_2O_3$, commonly referred to as alpha alumina. Preferred as the hydrated alumina is pseudoboehmite or boehmite alumina, particularly boehmite alumina obtained synthetically by the hydrolysis of aluminum alkoxides in the well known fashion. Typical methods for preparing such aluminum alkoxides are shown, for example, in U.S. Pat. No. 4,242,271, incorporated herein by reference for all purposes. The aluminum alkoxide can be hydrolyzed, in the well known fashion, such as by the process taught in U.S. Pat. No. 4,202,870, incorporated herein by reference for all purposes. Especially preferred are boehmite aluminas obtained from the hydrolysis of aluminum alkoxides derived from Ziegler Chemistry in the well known manner. However, it will be recognized that boehmite aluminas from other sources can be used in the process of the present invention. Examples of useful boehmite aluminas are those synthetic boehmite aluminas produced by processes such as disclosed in U.S. Pat. No. 4,676,928 or 4,646,503, incorporated herein by reference.

In the process of the present invention as applied to the growth of hydrated alumina crystals, a dispersion of an aqueous medium, e.g., deionized water, and hydrated alpha alumina seed crystals is formed. In theory, any amount of seed crystals, e.g. a single seed crystal, in the dispersion will suffice. However, from a practical point of view, the hydrated alumina seed crystals will generally be present in the dispersion in an amount of from at least about 0.01 percent by weight, amounts of from about 0.1 to about 15% by weight being conveniently used. While deionized water is suitable as the aqueous medium, additives to adjust pH, or additional dissolved ionic species can be included so long as they do not deleteriously affect the crystal growth mechanism. Additionally, it is contemplated that certain additives as for example, mineralizing agents, can be employed.

While the seed crystals of hydrated alumina employed can be obtained from any source, it is convenient to grow the seed crystals by hydrothermally treating a desired hydrated alumina at elevated temperatures and pressure and for a period of time until the desired crystal growth is achieved. Typically, such seed crystals can be obtained by heating suitable hydrated alumina, e.g. boehmite alumina, in a deionized water medium at a temperature of greater than about 250° F., preferably from about 350° F. to about 750° F. for a period of time of from about 2 to about 30 hours, the treatment being carried out under pressures substantially at or slightly greater than the vapor pressure of the water at the treating temperature. It will be apparent that, in effect, the desired seed crystals can be formed in situ simply by starting out with hydrated crystals of a smaller than desired size and continuing the hydrothermal treatment until the desired seed size is obtained.

The feed material used to grow the hydrated alumina crystals, generally but not necessarily the same hydrated alumina as the seed crystals, may be introduced either in the form of a dry powder or, preferably and for ease in commercial operations, in the form of an aqueous slurry. The mixture of the aqueous medium, the seed crystals and the feed material should be generally uniform and to this end it is preferred that the mixture be agitated in some manner as, for example, in a stirred reactor. The feed material is introduced in an amount and at a rate which will effect growth of the seed crystals. The addition of too little feed material too slowly will not grow the seed crystals at the maximum rate. Addition of too much feed material too quickly will result in the formation of a second colony of seed crystals which will compete with the original seed crystals for feed. In practice, it will be apparent to those skilled in the art that the amount and rate of addition of the feed material is related to the surface area of the seed crystals as well as the rate of dissolution/redeposition which is dependent on the kind of feed material and process conditions. As is well known, the rate of dissolution/redeposition is dependent upon the particular hydrated alumina used, process conditions, e.g. the temperatures employed, the concentration of the seed crystals/feed material, the types of additives present, crystal size, etc. Also, the amount and rate of addition of the feed material is dependent upon whether the feed material is introduced intermittently into the mixture or at a continuous rate. For any given system, the amount and rate of addition of the feed material, whether the process be conducted by intermittent introduction or continuous introduction of the feed material, can be determined by sampling the contents of the seed/feed mixture periodically and determining crystal size as for example, by x-ray diffraction techniques.

While the feed material used in growing hydrated alumina crystals can comprise any hydrated alumina, it is preferred to use hydrated alumina crystals, e.g., boehmite crystals. It is to be understood, however, that amorphous forms of hydrated aluminas can be employed as the feed material. While generally considered to be non-crystalline in nature, such amorphous hydrated aluminas are in actuality formed of alumina crystals which are generally too small to measure by conventional techniques. In any event, any hydrated alumina which is made up of alumina entities, be they true crystals or not, can be employed as feed material provided the average size of such entities is smaller than the average crystal size of the alumina seed crystals.

The mixture of the aqueous medium, the seed crystals and the feed crystals/material is maintained under hydrothermal conditions for a desired period of time in order to obtain the desired amount of product having an average crystal size of about 150 Angstroms or greater. For example when used in making ceramic parts, a crystal size of from about 150 to about 10,000 Angstroms, especially from about 200 to about 7500 Angstroms, is preferred. In general, the process will be conducted at a temperature of from about 150 ° F. to about 700° F., at a pressure at or slightly above the vapor pressure of water at the particular temperature being employed and under conditions, e.g., agitation, which give a generally uniform distribution of the seed/feed in the mixture. Higher pressures, e.g. from about 2 to about 220 atmospheres can be employed if desired. The pH will generally be maintained in a range of from about 3 to about 11. Generally speaking, the desired degree of crystal growth can be obtained, depending upon the type of reaction being conducted, i.e, continuous or intermittent, in a period ranging from about 1 to about 24 hours. It is to be understood that growth of the seed crystals will continue so long as feed material is available. If the addition of feed material, e.g. crystals, is stopped, crystal growth rate of the seed crystals decreases substantially.

To more fully illustrate the present invention, the following non-limiting examples are presented. In the examples which follow, the hydrated alumina employed was a boehmite alumina known as CATAPAL® alumina and marketed by Vista Chemical Company.

EXAMPLE 1

A flowable slurry was prepared from CATAPAL® alumina and deionized water, the slurry containing approximately 10% by weight alumina. The slurry was placed in a high pressure sample bomb and placed in a heated chamber at 350° F. The chamber was equipped with a roller mechanism whereby the sample bomb could be continuously rolled to provide agitation and maintain a uniform distribution of the hydrated alumina in the deionized water. Samples of the hydrothermally treated hydrated alumina were removed at various times, and analyzed by x-ray diffraction for crystal size. The results are shown in Table 1 below.

EXAMPLE 2

The procedure of Example 1 was repeated except the treatment temperature employed was 440° F. The results are shown in Table 1 below.

TABLE 1

| TIME | EXAMPLE 1 (350° F.) CRYSTAL SIZE (Å) 020 | EXAMPLE 1 (350° F.) SURFACE AREA (M2/G) | EXAMPLE 2 (440° F.) CRYSTAL SIZE (Å) 020 |
| --- | --- | --- | --- |
| 0 hours | 28 | 291 | 35 |
| 2 hours | 99 | 135 | |
| 3 hours | 103 | 130 | |
| 6 hours | 129 | 112 | |
| 8 hours | 144 | 106 | |
| 14 hours | 180 | 95.5 | |
| 16 hours | | | 330 |
| 24 hours | 245 | 73.8 | 400 |
| 48 hours | | | 460 |

As can be seen from reviewing the results of Table 1, the majority of the crystal growth from batch hydrothermal treatment occurs during about the first sixteen (16) hours of treatment. It is also apparent that in a batch system, crystal size approaches some larger size than the size of the starting material fairly quickly whereupon the growth rate slows considerably. Also, as will be apparent from the data in Table 1, the crystal size appears to be related to the temperature of hydrothermal treatment—higher temperatures resulting in larger crystal size for a given treatment time.

EXAMPLE 3

This example demonstrates the process of the present invention in commercial scale equipment using in situ formation of seed crystals and incremental injection of feed crystals. One thousand pounds (1,000 lb) of a CATAPAL® alumina slurry containing 12.1% $Al_2O_3$ and 7,500 pounds of deionized water were placed in a large, agitated, heated reactor. While agitating, the reactor was heated to 350° F. and held at this temperature, samples being collected every hour. After four (4) hours of hydrothermal treatment, an additional 1,960 pounds of the alumina slurry was added. The contents of the reactor were maintained at 350° F. and the hydrothermal aging continued. Additional increments of alumina slurry were added about every hour with samples of the reactor contents taken just prior to addition of the slurry.

After the last slurry addition was completed, the reactor was maintained at a temperature of 350° F. for an additional four (4) hours. In all cases, samples taken from the reactor were analyzed for crystallite size by x-ray diffraction. The data are shown in Table 2 below.

TABLE 2

| RUN TIME | SLURRY ADDITION (LBS) | TOTAL SLURRY (LBS) | SURFACE AREA (M2/G) | CRYSTAL SIZE (Å) 020 |
| --- | --- | --- | --- | --- |
| 0 | 1000 | 1000 | 260 | 37 |
| 1.0 | | 1000 | 152 | 94 |
| 2.0 | | 1000 | 134 | 110 |
| 3.0 | | 1000 | 116 | 130 |
| 4.0 | 1960 | 2960 | 109 | 140 |
| 5.0 | 2100 | 5060 | 98.10 | 150 |
| 6.0 | 2040 | 7100 | 75.60 | 200 |
| 6.6 | | 7100 | 65.80 | 250 |
| 7.0 | 1940 | 9040 | 62.70 | 260 |
| 8.0 | 2060 | 11100 | 54.10 | 310 |
| 9.0 | | 11100 | 47.60 | 370 |
| 9.5 | 4920 | 16020 | 64.50 | 410 |
| 10.0 | | 16020 | 47.10 | 450 |
| 10.5 | 4900 | 20920 | 43.60 | 450 |
| 11.5 | 4980 | 25900 | | |
| 12.5 | 7440 | 33340 | 40.20 | 540 |
| 13.5 | 4700 | 38040 | 43.40 | 540 |
| 14.5 | | 38040 | 39.90 | 530 |
| 15.5 | | 38040 | 37.00 | 530 |
| 16.5 | | 38040 | 35.40 | 550 |
| 17.5 | | 38040 | 33.90 | 570 |

It can be seen from Table 2 that crystal growth occurs at a rapid pace initially and then slows. Indeed, it appears that crystal growth slows considerably after about 4 hours. As can also be seen from the dam, the addition of more alumina slurry results in a substantial increase in measured crystal size of the treated material. In this regard it will be observed that the average crystal size of the hydrated alumina in the initial alumina slurry which is what is intermittently fed or added is less than the average crystal size of the seed crystals which have resulted from the hydrothermal treatment of a hydrated alumina in the initially added slurry. As can also be seen, as long as feed crystals are added, crystal growth continues, crystal growth essentially stopping when the addition of feed crystals is ceased.

EXAMPLE 4

This example demonstrates in situ formation of seed crystals and continuous injection of feed crystals. Approximately 8,000 pounds of a CATAPAL® alumina slurry containing 11.2% $Al_2O_3$ and 2,000 pounds of deionized water were placed in a reactor as described in Example 3. A small amount of nitric acid (0.0012 pound/pound $Al_2O_3$) and $CO_2$ (0.1 pound/pound $Al_2O_3$) were added to the reactor. The reactor contents were heated to 350° F. and maintained at that temperature throughout the remainder of the experiment. After 4 hours of hydrothermal aging, continuous alumina slurry addition was begun at an injection rate of approximately 10,000 lb/hr. After an additional 32,500 pounds of slurry was injected, alumina slurry injection was halted and the reactor maintained at 350° F. for several more hours. Samples were taken from the reactor periodically throughout the experiment. The data are shown in Table 3 below.

TABLE 3

| TIME (HOURS) | COMMENTS | TOTAL SLURRY (LBS) | SURFACE AREA (M2/G) | CRYSTAL SIZE (Å) 020 |
| --- | --- | --- | --- | --- |
| 0 | INITIAL CHARGE | 8320 | 325 | 28 |
| 0.5 | | 8320 | 318 | 33 |
| 1.0 | | 8320 | 223 | 56 |
| 1.5 | | 8320 | 138 | 113 |
| 2.5 | | 8320 | 103 | 150 |
| 4.0 | BEGIN INJECTION | 8320 | | |
| 6.5 | | 34420 | 75.6 | 425 |
| 7.7 | INJECTION COMPLETE | 40820 | | |
| 8.7 | | 40820 | 52.7 | 634 |
| 9.7 | | 40820 | 38.3 | 669 |
| 16.7 | | 40820 | 39.9 | 734 |

As in the case of intermittent injection, it can be seen that rapid crystal growth occurs in the first four (4) hours and that addition of more alumina slurry results in a substantial increase in measured crystal size. Significant with respect to both Examples 3 and 4 is that seed crystals, i.e., the alumina crystals in the initial alumina slurry, grew considerably larger than would be expected from a simple batch hydrothermal treatment at the same temperature and a comparable length of time. Compare for example the data in Tables 2 and 3 with the data in Table 1. These data are graphically illustrated in the Figure where it can clearly be seen that at the same temperature and at a comparable length of time, crystal growth occurred more rapidly and to a larger size in those cases where feed crystals were added to the initial seed crystals during the hydrothermal treatment.

By using the process of the present invention, it is possible to relatively quickly obtain hydrated alumina crystals, in good quantity, having an average crystal size of greater than 150 Angstroms, preferably from about 150 to about 10,000 Angstroms.

In describing the process above with respect to the growth of hydrated alumina crystals, and in the majority of crystal growth cases involving metal oxides, an aqueous medium will be employed. However, it is to be understood that the process can be carried out under supercritical conditions in which crystal growth is occurring virtually by sublimation of feed material and redeposition on the growth site. Additionally, the process can be conducted using non-aqueous systems or systems in which water is a minor component of the fluid medium. Various additives can be added to the fluid medium to aid in the dissolution of the feed material and the redeposition of the soluble nutrient species on the seed crystal. Thus, aqueous solutions of various inorganic salts can be employed with advantage under certain conditions. As mentioned, it will also be apparent that depending upon the type of crystal growth sought, temperature and pressure conditions much higher than those utilized for the growth of hydrated alumina crystals may be necessary and/or desirable. For example, in growing corundum (alpha alumina) crystals, temperatures and pressures would likely be higher regardless of whether the feed material was alpha alumina, a hydrated alumina or a mixture thereof.

The process of the present invention can be conducted in continuous reaction systems which approximate batch or plug flow reaction systems. Thus, a tubular reactor containing the seed crystals could be provided with one or more injection ports for feed material. Additionally, the process could be carried out in a series of continuous stirred reactors.

The foregoing disclosure and description of the invention is illustrative and explanatory thereof, and various changes in the method steps may be made within the scope of the appended claims without departing from the spirit of the invention.

What is claimed is:

1. A process for increasing the rate of crystal growth comprising:

providing a dispersion of a fluid medium and at least one seed crystal comprising a metal oxide species, said metal oxide species being sufficiently insoluble in said fluid medium to provide a solid growth site;

introducing feed material into said dispersion and forming a generally uniform mixture of said seed crystal and said feed material, said feed material comprising a metal oxide species, said feed material having an average crystal size less than the average crystal size of said seed crystal, said feed material being added in an amount and at a rate sufficient to effect growth of said seed crystal, said feed material having sufficient solubility in said fluid medium to provide a soluble nutrient species for deposition on said seed crystal to effect said growth, said feed material being introduced over a given period of time during which crystal growth is occurring;

treating the mixture of said seed crystal and said feed material under conditions which stimulate crystal growth for a period of time sufficient to obtain a desired quantity of a product comprising at least one grown crystal having a desired average crystal size greater than the average crystal size of said seed crystal.

2. The process of claim 1 wherein said mixture has a pH of from about 3 to about 11.

3. The process of claim 1 wherein said metal oxide species comprises a hydrated metal oxide.

4. The process of claim 1 wherein said seed crystals comprise alpha alumina.

5. The process of claim 4 wherein said feed material comprises a compound selected from the class consisting of alpha alumina, hydrated aluminas and mixtures thereof.

6. The process of claim 1 wherein said fluid medium comprises an aqueous medium.

7. The process of claim 1 wherein said seed crystal comprises a hydrated alumina and said feed material comprises hydrated alumina crystals.

8. The process of claim 7 wherein said fluid medium comprises an aqueous medium.

9. The process of claim 8 wherein said seed crystals are formed by hydrothermally treating an aqueous slurry of hydrated alumina at a temperature above about 150° F. and at a pressure sufficient to prevent any substantial loss of water by vaporization at the treating temperature, said dispersion comprising said treated aqueous slurry.

10. The process of claim 8 wherein said seed crystals and said feed crystals comprise boehmite.

11. The process of claim 9 wherein the hydrothermal treatment of said seed crystals is conducted at a temperature of from about 250° F. to about 700° F.

12. The process of claim 1 wherein said mixture is agitated to maintain said uniform mixture.

13. The process of claim 1 wherein said feed material is added incrementally over said period of time.

14. The process of claim 1 wherein said feed material is added continuously over said period of time.

15. The process of claim 10 wherein said feed material is introduced as a dried powder.

16. The process of claim 10 wherein said feed material is introduced as an aqueous slurry.

* * * * *